United States Patent [19]

Ujiie

[11] Patent Number: 5,457,538
[45] Date of Patent: Oct. 10, 1995

[54] APPARATUS FOR VISUALLY DETERMINING THE CORRECT SOLDERING POSITION OF AN ELECTRONIC COMPONENT WITH RESPECT TO A PRINTED CIRCUIT BOARD

[75] Inventor: Kazuo Ujiie, Tokyo, Japan

[73] Assignee: M and M Products Co., Ltd., Tokyo, Japan

[21] Appl. No.: 202,255

[22] Filed: Feb. 25, 1994

[30] Foreign Application Priority Data

Oct. 18, 1993 [JP] Japan .................................. 5-284038

[51] Int. Cl.$^6$ .................................................. G01B 11/00
[52] U.S. Cl. .......................... 356/399; 356/400; 348/87
[58] Field of Search .................................. 356/399, 400; 348/87, 126

[56] References Cited

U.S. PATENT DOCUMENTS

| 3,684,384 | 8/1972 | Hojo et al. ............................. 356/399 |
| 5,311,304 | 5/1994 | Monno .................................... 356/399 |

FOREIGN PATENT DOCUMENTS 0218516 12/1984 Japan .................................... 356/399

OTHER PUBLICATIONS

J. V. Culver, "Two Color Optical Alignment System", Mar. 1975, p. 2983, vol. 17, No. 10, IBM Technical Disclosure Bulletin.

C. A. Gaston, "Alignment Beamsplitter Cube", Oct. 1982, pp. 2301–2303, vol. 25, No. 5, IBM Technical Disclosure Bulletin.

*Primary Examiner*—F. L. Evans
*Assistant Examiner*—Robert Kim
*Attorney, Agent, or Firm*—Pollock, Vande Sande & Priddy

[57] ABSTRACT

An electronic-component holder comprises an image superimposing device comprising a semitransparent mirror 34 and a plane mirror 36 that, in combination, horizontally reflect the images of two objects, one placed over the other, to the same point, an image extracting device 50 that reflects the partial images in the diagonal fields of the image superimposing device in opposite and horizontal directions, and a solid image reproducing device 84 that converts the image from the image extracting device into a picture signal that are disposed between a semiconductor device D and a printed circuit board C that is placed below the semiconductor device D. The image superimposing device combines the image of the lead $L_1$ on the back of the semiconductor device D and that of the conductor pattern on the front of the printed circuit board C into one composite image. The image extracting device 50 conveys to the solid image reproducing device only a portion of the image of the semiconductor device extracted from the diagonal fields. The positioner is capable of positioning even larger electronic components with high precision without increasing the size of the optical system.

6 Claims, 6 Drawing Sheets

APPARATUS FOR VISUALLY DETERMINING THE CORRECT SOLDERING POSITION OF AN ELECTRONIC COMPONENT WITH RESPECT TO A PRINTED CIRCUIT BOARD

FIELD OF THE INVENTION

This invention relates to electronic-component positioners function to pinpoint the relative position of semiconductor devices and other electronic components to be mounted on printed circuit boards.

BACKGROUND OF THE INVENTION

To solder semiconductor devices according to a circuit pattern of electrical conductors on a printed circuit board, the semiconductor devices must be first placed in their correct soldering position.

Conventionally, this positioning has been implemented by visually checking the relative position of the leads of the semiconductor devices and the circuit pattern of the printed circuit board. However, the accuracy and efficiency of this visual method have decreased with an increase in the density of circuit integration and a resulting decrease in the lead pitch.

The solutions for this problem disclosed in U.S. Pat. Nos. 5,060,288 and 5,235,407, for example, pick up an image of semiconductor devices just before they are aligned to the circuit pattern of a printed circuit board on to which they are to be soldered. The obtained picture is enlarged on a display for checking whether they are properly aligned or not.

These methods check the accuracy of alignment based on images taken from above the semiconductor devices to be mounted. Therefore, they are too some extent effective for semiconductor devices of the type whose leads project outward. However, they are incapable of checking the alignment of the leads of semiconductor devices of the PLCC package type whose leads are provided on the back thereof, as shown at (a) in FIG. 10, with the circuit pattern on printed circuit boards. This problem is solved by marking points for aligning semiconductor devices on a printed circuit board to permit indirect confirmation of their alignment. However, this method is not without problems with reliability.

To overcome these shortcomings of the conventional methods, the inventor proposed a positioner that brings the leads of semiconductor devices and a circuit pattern into proper alignment by using a composite image thereof formed by means of a semitransparent mirror interposed between the devices and a substrate on to which they are to be mounted, with the lead terminals and the circuit pattern thereof disposed to face each other, as disclosed in Japanese Provisional Patent Publication No. 171998 of 1992.

This positioner permits accurate positioning as the position of the semiconductor devices and circuit pattern is directly confirmed.

With the recent rapid development of integrated circuits, not only the size of semiconductor devices but also the density of lead pin arrangement has increased. Accurate positioning of such complex devices necessitates higher magnifications than can be obtained by increasing the size of the semitransparent mirror. However, a larger semitransparent mirror requires a correspondingly larger camera and other optical devices that may, in combination, not be operated as efficiently as smaller ones.

SUMMARY OF THE INVENTION

The electronic-component positioner according to this invention solves the aforementioned problems of the conventional positioners. It is capable of efficiently and accurately positioning even larger electronic components with higher densities. The electronic-component positioner according to this invention comprises an electronic-component holder for gripping an electronic component with its back directed downward and vertically moves the clamped component. A substrate holder disposed below the electronic component holder horizontally grips a substrate board with printed circuits. An image composing device reflects two objects disposed on a vertical line, one on top of the other, to the same point in a horizontal plane. An image extracting device to reflect a partial image in the diagonal field of the image composing device and then reflecting the obtained image in a horizontal direction. A photoelectric converting device to converts an image from the image extracting device into a picture signal and a display unit displays an image reproduced from the picture signal.

OBJECTS AND EFFECTS OF THE INVENTION

An object of this invention is to provide an electronic-component positioner that feeds to the photoelectric converting device an image extracted from only a field necessary for positioning. This design permits reducing the distance between the electronic component, regardless of the size thereof, and the photoelectric converting and image composing devices. This positioner determines if the electronic component is in proper alignment by means of an image enlarged from the extracted image to the desired magnification. Another object of this invention is to provide an electronic-component positioner that is capable of accurately positioning even electronic components whose leads or other connectors are disposed on the back and unobservable from the upper side. This positioner achieves accurate positioning by observing the alignment between the electronic component and the circuit pattern on the substrate from a vertical direction, without introducing errors due to differences in the visual angle.

BRIEF DESCRIPTION OF THE DRAWINGS

Details of this invention, its advantages and features will become explicit by referring to the accompanying drawings and a detailed description given later.

DETAILED DESCRIPTION OF THE PREFERRED EMBODIMENTS

Figure 1:
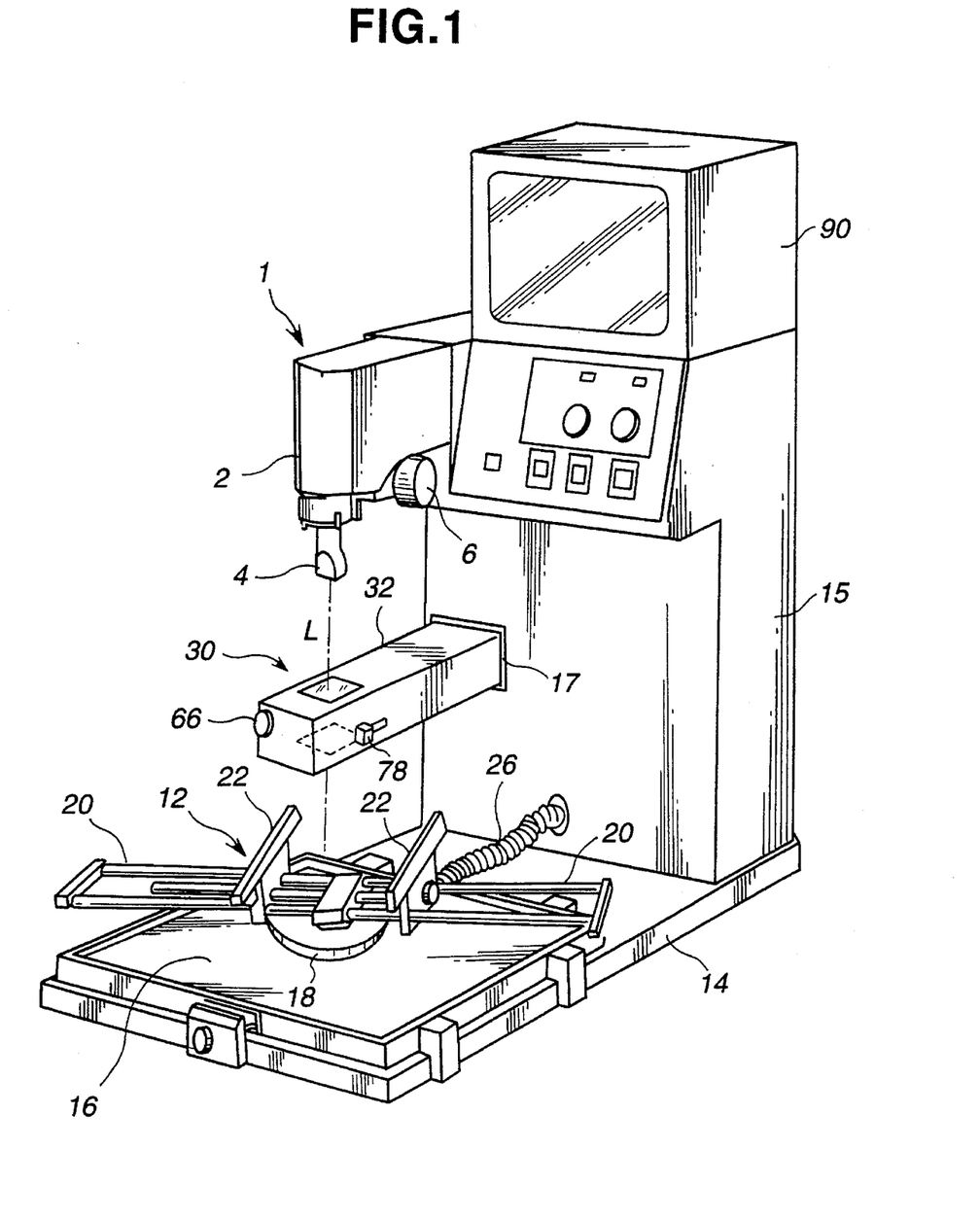
FIG. 1 is a schematic view of a soldering machine fitted with an electronic-component positioner according to this invention.

FIG. 1 shows an electronic-component positioner of this invention fitted to a soldering machine. Reference numeral 1 designates a hot-gas soldering machine. A vertically expandable pipe 3 leads the hot gas from a hot-gas generator contained in a body 2 to a nozzle 4 at the lowermost end thereof. The hot gas is blown through the nozzle 4 against the leads of a semiconductor device D fastened thereto.

Figure 2:
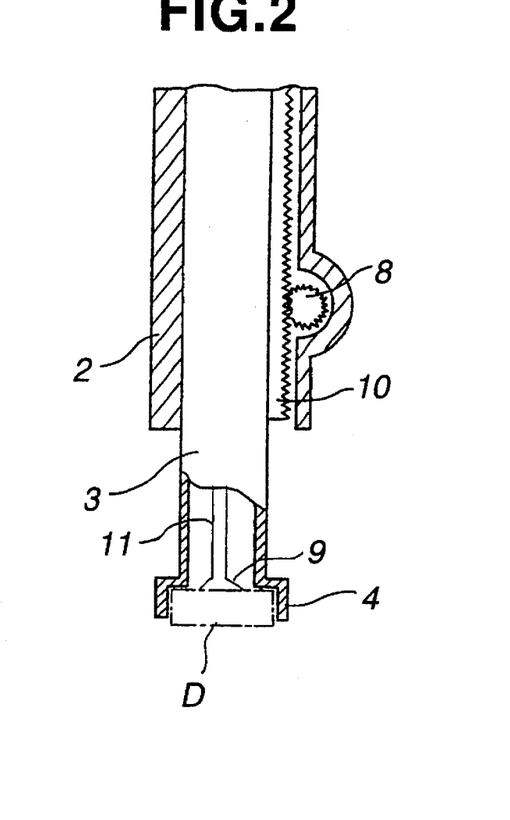
FIG. 2 is a cross-sectional view enlarging the vicinity of the nozzle of a hot-gas soldering machine.

The pipe 3 has a rack 10 that meshes with a pinion 8 connected to a knob 6, as shown in FIG. 2. By turning the knob 6, the nozzle 4 is moved up and down along a vertical line L. The pipe 3 contains therein a suction nozzle 9 that holds the semiconductor device D in alignment with the center line of the pipe 3 and a tube 11 to supply a negative pressure to the suction nozzle 9.

Figure 3:
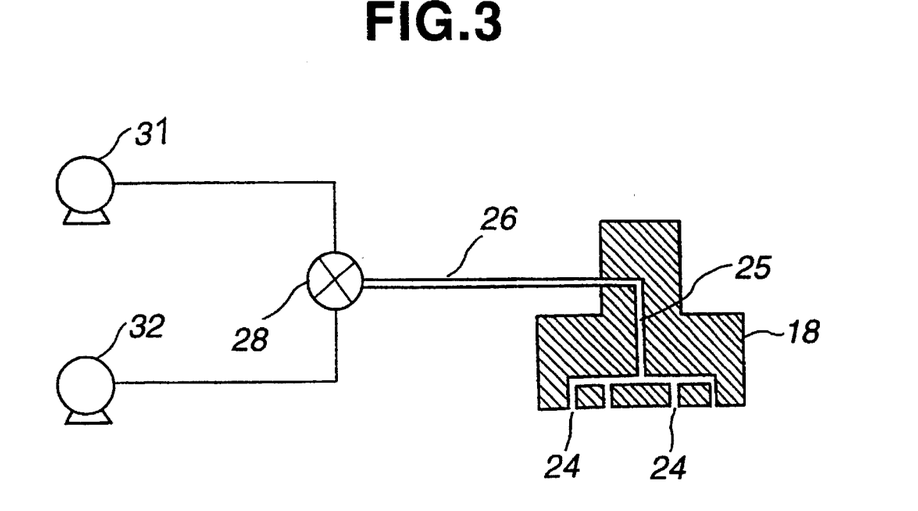
FIG. 3 shows a pipeline to supply pneumatic air and negative pressure to the base of the substrate holder.

Reference numeral 12 denotes a printed circuit board holder that comprises a base 18 adapted to slide over the surface of a circuit board 16 mounted on a table 14 through a fine-adjustment mechanism not shown, a pair of guides 20 attached to the base 18, and a pair of chucks 22 to hold the circuit board 16 therebetween mounted on the guides 20. The base 18 has multiple holes 24 in the bottom thereof, as shown in FIG. 3. The holes 24 connect to a connection pipe 25 that connects to an air pump 31 and a suction pump 32 through a tube 26 and a changeover valve 28. The air supplied from the air pump 31 and blown out from the holes 24 in the bottom of the base 18 minimizes the friction against the movement thereof over the surface of the circuit board 16. When a negative pressure is supplied from the suction pump 32 after positioning is complete, the base 18 adheres to the circuit board 16. When necessary, fine adjustment of the circuit board 16 can be made by moving it transversely and longitudinally by means of the aforementioned fine-adjustment mechanism.

Reverence numeral 30 designates an observation device comprising a container 32 containing an optical system described later. The container 32 fitted in a hole 17 perforated in an upright stand 15 reciprocates in the direction of arrow A between a point where the presence thereof offers no interference to the downward movement of the nozzle 4 accommodating the suction nozzle 9 and another where the observation of the semiconductor device D held by the suction nozzle 9 is possible.

Figure 4:
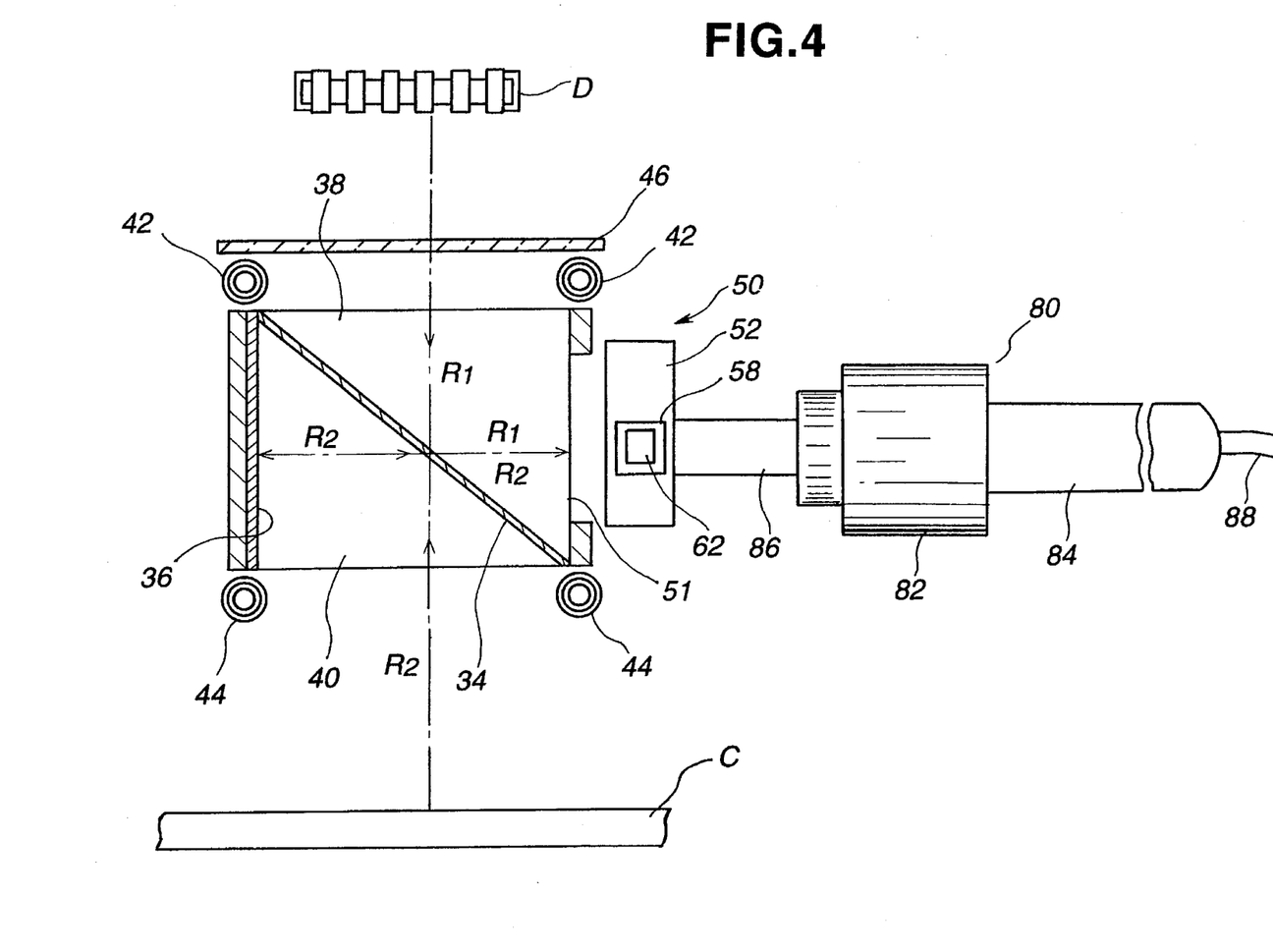
FIG. 4 shows a system to observe the electronic component and substrate in the electronic-component positioner of this invention.

FIG. 4 shows an example of the observation device 30 consisting essentially of an optical system contained in the container 32. Reference numeral 34 designates a semitransparent mirror that reflects the image of the semiconductor device D, which is held thereabove by the electronic-component holder, horizontally toward the right in the illustration and that of the printed circuit board C, which is located therebelow, horizontally toward the left. Reference numeral 36 denotes a plane mirror that reflects the image of the printed circuit board C reflected by the semitransparent mirror 34 in the direction of the semitransparent mirror 34 or toward the right in the illustration. At the same time, the plane mirror 36 functions to adjust the position of the image below so that the image formed in the same vertical line on the opposite side of the semitransparent mirror 34 is coincidently positioned or superimposed therewith at the exit window 51. The semitransparent mirror 34 used in this embodiment consists of two right-angle prisms 38 and 40 disposed with the hypotenuse of one kept in contact with that of the other. The hypotenuse of one prism coated with a metallic film is bonded to that of the other prism using an optical adhesive.

Reference numeral 42 designates small lamps disposed along the upper four sides of the upper prism 38 so as to throw light upon the semiconductor device D through a red or other colored filter 46. Reference numeral 44 designates small lamps disposed along the lower four sides of the lower prism 40 so as to throw light upon the circuit board C. As the lamps 42 and 44 have independent illumination-intensity regulating devices, either or both of the semiconductor device and circuit board can be lighted with the desired intensity of illumination.

Figure 5:
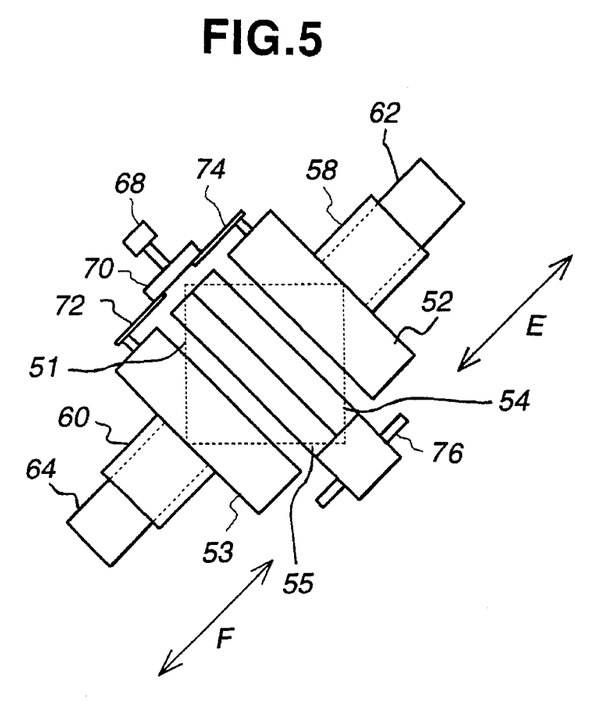
FIG. 5 shows the image extracting device, with the third and fourth plane mirrors placed in positions to permit the enlargement of the diagonal field of a semiconductor device and viewed from the emerging side.

Reference numeral 50 designates an image extracting device provided at the exit port 50. The image extracting device 50 comprises a first plane mirror 52 and a second plane mirror 53 that reflect images extracted from two opposite diagonal fields at the substantially square exit port 50 toward the center and a third and a fourth plane mirrors, 54 and 55, that horizontally reflect the light from the first and second plane mirrors 52 and 53. The first and second plane mirrors 52 and 53 are fastened to holders 58 and 60 that are slidable in the direction of the diagonal of the prisms 38 and 40 or that of the square exit window 51 by means of guide members 62 and 64. A transmission mechanism 68 is connected to a knob 66 on the container 32 through another transmission mechanism not shown. By operating levers 72 and 74 attached to a drive plate 70 rotated by the transmission mechanism 68, the first and second plane mirrors 52 and 53 are moved an equal distance in directions indicated by arrows E and F.

The third and fourth plane mirrors 54 and 55 are attached to the two surfaces of a triangular block containing a right angle therebetween, with one end thereof rotatably supported by a spindle 76. The third and fourth plane mirrors 54 and 55 are moved between a vertical position and a horizontal position by means of a lever 78 on the container 32.

Figure 6:
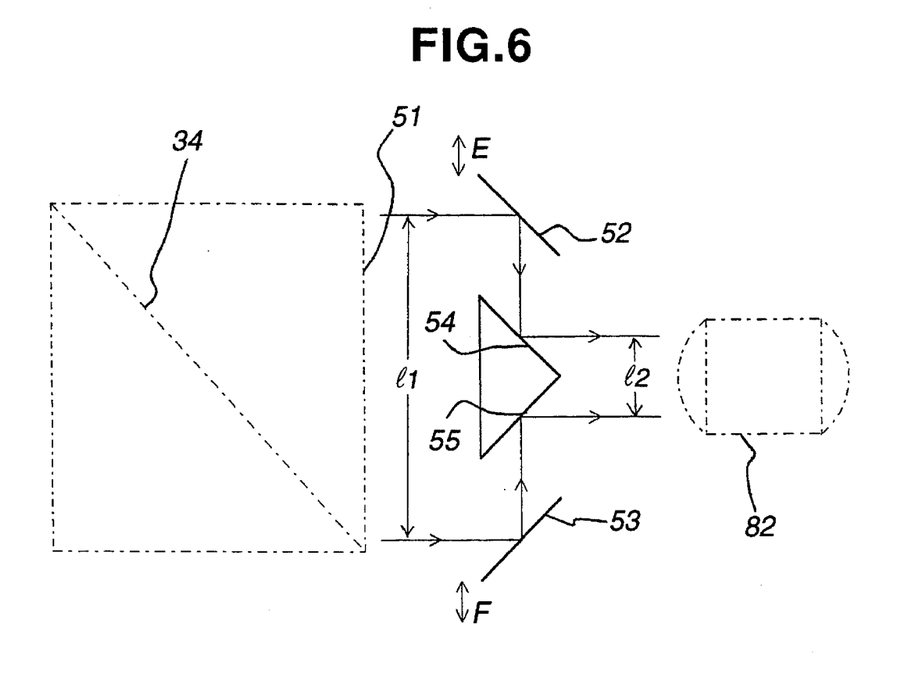
FIG. 6 shows the location of a first to a fourth plane mirrors that make up the image extracting device.

FIG. 6 shows the relative positions of the first to fourth plane mirrors 52, 53, 54 and 55. The first and second plane mirrors 52 and 53 are each disposed 45 degrees away from the optical axis passing through the midpoint of the exit window 51 so as to reflect the images in the diagonal fields thereof to the directions of the third and fourth plane mirrors 54 and 55. The images reflected by the third and fourth plane mirrors 54 and 55 are 90 degrees away from those from the plane mirrors 52 and 53 and parallel to each other, with the space $l_1$ between the two images in the diagonal fields reduced to $l_2$ that is small enough for pickup.

In FIG. 4 again, reference numeral 80 denotes the camera mentioned before, which comprises a pickup lens 82 and a charge-coupled device (CCD) or other solid image reproducing device 84. The camera 80 is movable along a guide 86 in the direction of the optical axis. The picture signal from the solid image reproducing device 84 is sent through a cable 88 to an image processor not shown. The image properly processed and magnified approximately ten times is then displayed on a monitor 90 that consists of a cathode-ray tube or a liquid crystal display.

Figure 8:
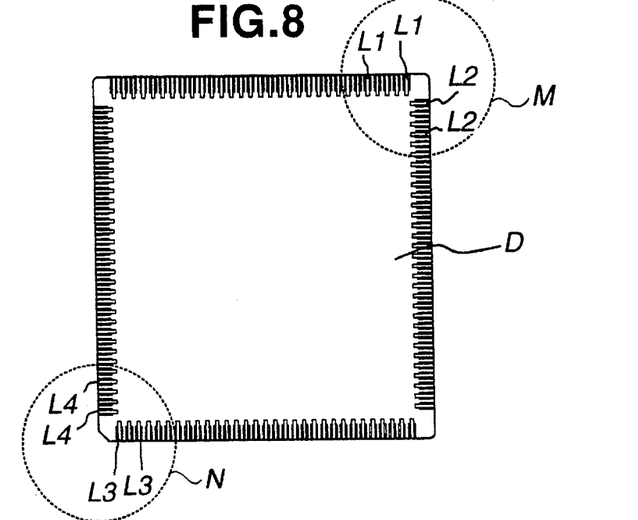
FIG. 8 shows an example of a semiconductor device to be positioned on a printed circuit board.
Figure 9:
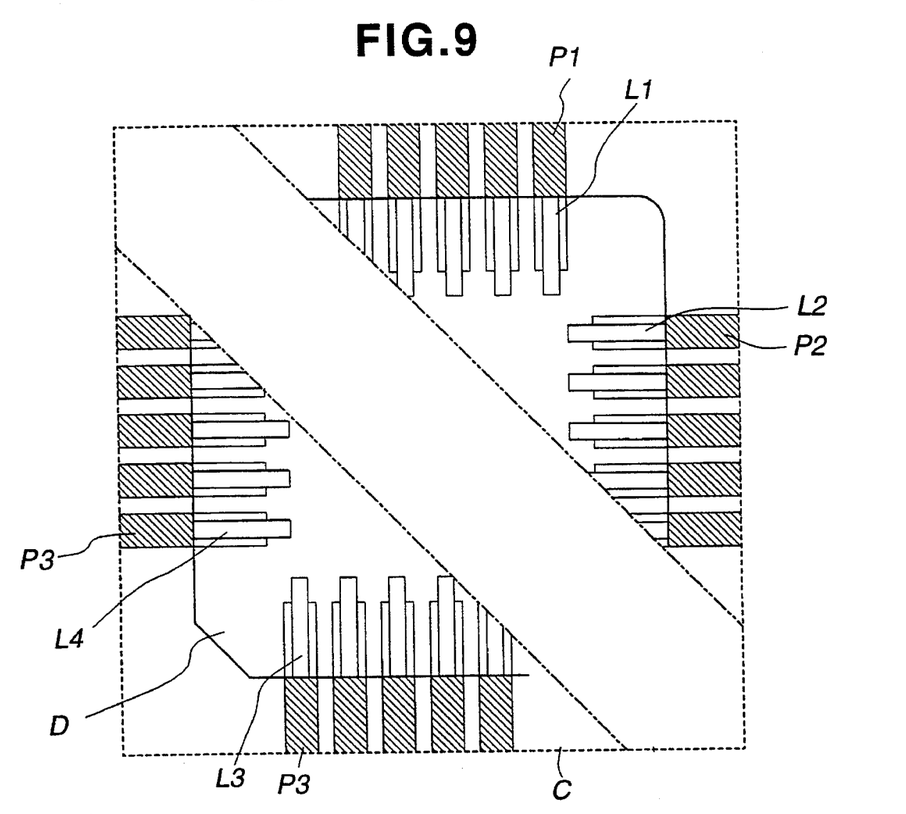
FIG. 9 shows an image obtained by superimposing an enlarged image of the diagonal field of a semiconductor device on the printed circuit board.

In this embodiment, the suction nozzle 9 holds a semiconductor device D, such as one of the PLCC type that has leads $L_1$, $L_2$, $L_3$ and $L_4$ on the back of the case thereof as shown in FIG. 8, with the nozzle 4 raised upward by means of the knob 6. The printed circuit board holder 12 holds a printed circuit board C in position. The printed circuit board has circuit patterns $P_1$, $P_2$, $P_3$ and $P_4$ formed by applying a soldering paste at the points where the leads $L_1$, $L_2$, $L_3$ and $L_4$ are to be connected. The observation device 30 is pulled out to below the nozzle 4 (as shown in FIG. 1). Then, the printed circuit board holder 12 is adjusted so that the patterns $P_1$, $P_2$, $P_3$ and $_4$ on the printed circuit board C are substantially positioned just below the semiconductor device D.

When the upper and lower sets of lamps 42 and 44 are lighted in this state, the semitransparent mirror 34 reflects, from above, an image $R_1$ of the semiconductor device D held by the suction nozzle 9 to the exit window 51 and, from below, an image $R_2$ of the printed circuit board C to the plane mirror 36. The plane mirror 36 reflects the image back to the semitransparent mirror 34 that transmits the image to the exit window 51. As the plane mirror 36 is positioned so that the upper and lower images on the same vertical line are superimposed at the exit window 51, a composite image reflecting the positional relationship of the semiconductor device D and printed circuit board C is formed at the exit window 51.

Illuminated with a light passed through the colored filter 46, the whole image of the semiconductor device D is colored, red in the example being discussed. Therefore, the leads $L_1$, $L_2$, $L_3$ and $L_4$ of the semiconductor device D are red-colored, whereas the patterns $P_1$, $P_2$, $P_3$ and $P_4$ of the circuit board C are solder-paste colored. Therefore, the upper and lower images are readily distinguishable. The ease of distinguishing can be further increased by adjusting the intensity of illumination of the upper and lower lamps 42 and 44 as required.

When the first and second plane mirrors 52 and 53 are moved toward the diagonal of the exit window 51 by turning the knob 66 in this state, the plane mirrors 52 and 53 reflect only portions of the image of the semiconductor device D in the diagonal fields M and N (FIG. 8) to the third and fourth plane mirrors 54 and 55. The plane mirrors 54 and 55 horizontally reflect the received rays to the pickup lens 82 that sends enlarged images to the solid image reproducing device 84. The monitor 90 then displays a composite image that is made up by combining the images of the back of the semiconductor device D and the patterns $P_1$, $P_2$, $P_3$ and $P_4$ of the printed circuit board P, one over the other, in the diagonally disposed fields, as shown in FIG. 8.

The operator seeing this composite image adjust the position of the printed circuit board by finely adjusting the position of the board 16 or board holder 12 so that the leads $L_1$, $L_2$, $L_3$ and $L_4$ of the semiconductor device D coincide with the corresponding patterns $P_1$, $P_2$, $P_3$ and $P_4$ on the board. Because the semiconductor device D and printed circuit board C are separated from each other, the patterns $P_1$, $P_2$, $P_3$ and $P_4$ on the circuit board remain intact even when they are horizontally moved relative to each other.

On completion of positioning, the knob 6 of the hot-gas soldering machine 1 is turned to lower the semiconductor device held by the suction nozzle 9. Then, a detector not shown senses the descent of the semiconductor device, and the container 32 retracts. By further lowering the semiconductor device D on to the printed circuit board C until contact is made therebetween as confirmed on the monitor 90, the leads $L_1$, $L_2$, $L_3$ and $L_4$ of the semiconductor device D are correctly positioned on the patterns $P_1$, $P_2$, $P_3$ and $P_4$ on the printed circuit board C. After their relative positions have been confirmed, no displacement occurs because the semiconductor device D descends vertically.

Figure 7:
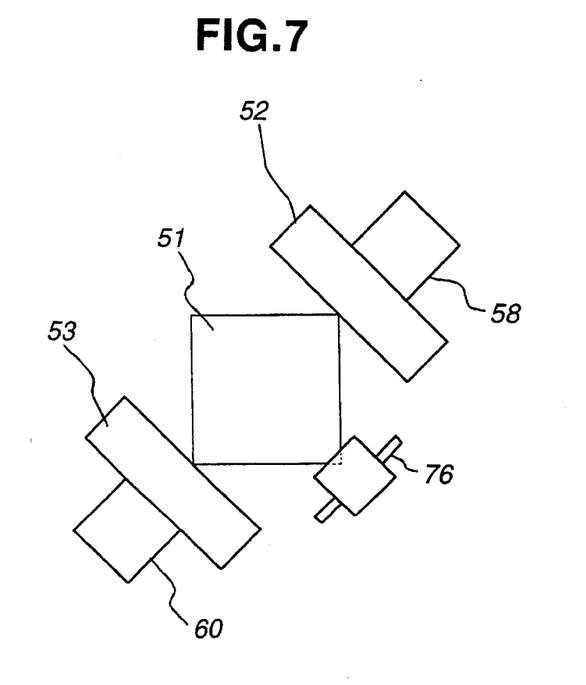
FIG. 7 shows the location of a third and a fourth plane mirrors that provide a magnification required for observing the whole of the semiconductor device.

When the semiconductor device D is small enough, the entire image thereof can be observed as described below. First, the lever 78 on the container 32 is turned to rotate the third and fourth plane mirrors 54 and 55 about the spindle 76 into a horizontal position. Then, the knob 66 is turned to retract the first and second plane mirrors 52 and 53 from the diagonal fields. Then, the entire area of the exit window 51 is opened to allow the whole image of the semiconductor device and the circuit board therearound to be conveyed into the solid image reproducing device 84. This permits viewing the entire image of the semiconductor device D superimposed on the image of the printed circuit board.

The embodiment just described is fitted to a hot-gas soldering machine to permit the semiconductor device held by the suction nozzle 9 to be soldered after it has been placed in proper position. Obviously, the same effect can be obtained by implementing positioning with a vacuum-actuated holder or a chuck or other mechanical holder and applying soldering using a separate soldering apparatus.

Figure 10A:
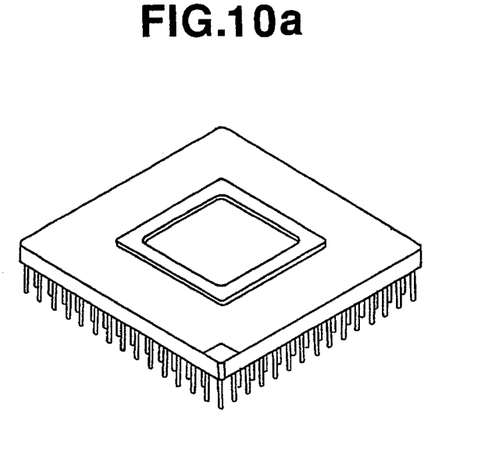
FIG. 10(a) and (b) shows examples of the pin configurations of semiconductor devices that can be positioned by the electronic-component positioner of this invention at (a) and (b).
Figure 10B:
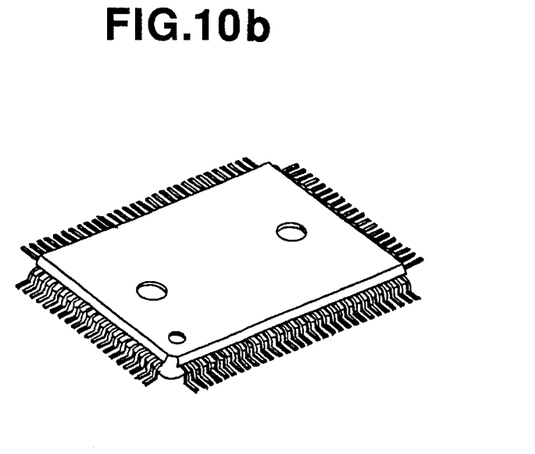

The embodiment described here is applied to a semiconductor device of the PLCC package type. This invention is also applicable to the PGA package whose pins protect downward from the back of the device and the QPF package whose pins project downward from the sides of the device, as shown at (a) and (b) in FIG. 10.

What is claimed is:

1. An electronic-component holder comprising:

vertically movable means for holding an electronic component with the back thereof disposed downward;

means disposed below the electronic component for holding a printed circuit board in a horizontal position;

image superimposing means for reflecting images of two objects disposed on a vertical line, one over the other, to the same point;

image extracting means for reflecting partial images in the diagonal fields of the image superimposing means in opposite and horizontal directions;

photoelectric means for converting the images from the image extracting means into a picture signal; and means for displaying an image reproduced from the picture signal.

2. An electronic-component holder according to claim 1, in which the image superimposing, image extracting and photoelectric converting means are contained in a horizontally reciprocatable container disposed between the electronic component and printed circuit board.

3. An electronic-component holder according to claim 1, in which the image extracting means comprises plane mirrors disposed so that the reflecting surfaces thereof are each 45 degrees away from the optical axis of the image superimposing means.

4. An electronic-component holder according to claim 1, in which the image extracting means is retractable from the optical path of the image superimposing and photoelectric converting means.

5. An electronic-component holder according to claim 1, in which intensity-controllable illuminating means are provided near the two light-entering windows of the image superimposing means.

6. An electronic-component holder comprising:

neans for holding an electronic component for vertical movement;

means for supporting a printed circuit board to face said electronic component;

an image superimposing means located between said electronic component and circuit board comprising:
   (a) a pair of right angle prisms having a common hypotenuse surface which is inclined with respect to said circuit board and electronic component;
   (b) a plane mirror located opposite one side of said hypotenuse; and,
   (c) first and second illuminating means on each side of said hypotenuse for illuminating said circuit board and electronic component, whereby images of said electronic component and circuit board are produced through an optical surface of said prisms opposite said mirror;

an image extracting means comprising first and second plane mirrors for reflecting partial images in diagonal fields of said electronic component and circuit board to third and fourth mirrors which reduces the space between said partial images;

a camera for receiving said partial images from said third and fourth mirrors; and, means connected to said camera for displaying said partial images, whereby the relative position of said circuit board and electronic component may be determined.

* * * * *